(12) United States Patent
Tanaka

(10) Patent No.: US 7,683,375 B2
(45) Date of Patent: Mar. 23, 2010

(54) THIN-FILM TRANSISTOR WITH CONTROLLABLE ETCHING PROFILE

(75) Inventor: Hiroaki Tanaka, Kanagawa (JP)

(73) Assignee: NEC LCD Technologies, Ltd., Kawasaki, Kanagawa (JP)

( * ) Notice: Subject to any disclaimer, the term of this patent is extended or adjusted under 35 U.S.C. 154(b) by 101 days.

(21) Appl. No.: 11/540,959

(22) Filed: Oct. 2, 2006

(65) Prior Publication Data
US 2007/0087486 A1   Apr. 19, 2007

(30) Foreign Application Priority Data
Oct. 3, 2005 (JP) ............................. 2005-289890

(51) Int. Cl.
H01L 21/84 (2006.01)
(52) U.S. Cl. ................. 257/72; 257/59; 257/E27.111
(58) Field of Classification Search ............... 257/59, 257/72, E27.111
See application file for complete search history.

(56) References Cited

U.S. PATENT DOCUMENTS 6,376,288 B1 *  4/2002  Jen et al. .................... 438/158

2006/0091469 A1 *  5/2006  Ho et al. .................... 257/368
2006/0131580 A1 *  6/2006  Yang et al. .................. 257/59

FOREIGN PATENT DOCUMENTS

| JP | 7-312425 | 11/1995 |
|---|---|---|
| JP | 3430097 | 5/2003 |
| JP | 2003-347543 | 12/2003 |

* cited by examiner

*Primary Examiner*—Wai-Sing Louie
*Assistant Examiner*—Tifney L Skyles
(74) *Attorney, Agent, or Firm*—McGinn IP Law Group PLLC

(57) ABSTRACT

A thin-film transistor includes a gate layer, a gate insulting layer, a semiconductor layer, a drain layer, a passivation layer (each of which being formed on or over an insulating substrate), and a conductive layer formed on the passivation layer. The conductive layer is connected to the gate layer or the drain layer by way of a contact hole penetrating at least the passivation layer. The passivation layer has a multiple-layer structure comprising at least a first sublayer and a second sublayer stacked, the first sublayer having a lower etch rate than that of the second sublayer. The first sublayer is disposed closer to the substrate than the second sublayer. The second sublayer has a thickness equal to or less than that of the conductive layer. The shape or configuration of the passivation layer and the underlying gate insulating layer can be well controlled in the etching process, and the conductive layer formed on the passivation layer is prevented from being divided.

11 Claims, 13 Drawing Sheets

THIN-FILM TRANSISTOR WITH CONTROLLABLE ETCHING PROFILE

BACKGROUND OF THE INVENTION

1. Field of the Invention

The present invention relates to a Thin-Film Transistor (TFT) and a method of fabricating the same and more particularly, to a TFT, a TFT array substrate, and a Liquid-Crystal Display (LCD) device, and methods of fabricating them, where the etching profile of an insulating layer is controllable in an etching process. The invention is applicable not only to LCD devices, but also to plasma display devices and display devices employing organic ElectroLuminescence (EL) or the like.

2. Description of the Related Art

Generally, the LCD device comprises a TFT substrate on which TFTs are arranged in a matrix array, an opposite substrate, and a liquid crystal layer sandwiched by the TFT substrate and the opposite substrate. Pixels are defined on the TFT array substrates. The TFTS, which are arranged to correspond to the respective pixels, turn the optical paths on or off in the respective pixels, thereby displaying images on the screen of the LCD device.

In the typical fabrication method of the TFT array substrate, a gate insulating layer and a patterned semiconductor layer are formed on or over a glass plate or the like and then, a passivation layer is formed to cover the gate insulating layer and the semiconductor layer. When etching the passivation layer and the gate insulating layer, a patterned photoresist film as a mask is formed on the passivation layer. Thereafter, the passivation layer and the gate insulating layer are selectively etched to form contact holes using the mask. In this case, the etch rates of the passivation layer and the gate insulating layer are set to be approximately equal to or less than the etch rate of the photoresist film or mask, thereby forming the contact holes with tapered profiles utilizing the simultaneous etching of the mask.

To raise the production capacity of an individual etching apparatus, an etch rate may be raised by changing the etching condition in a dry etching process. In this case, however, the raised etch rate of the photoresist mask is unable to follow the raised etch rates of the passivation layer and the gate insulating layer and as a result, there is a possibility that the etching profile of the contact holes penetrating the passivation layer and the gate insulating layer is square or inverted tapered. If so, a conductive layer to be formed on the passivation layer to contact the underlying gate layer or drain layer will be divided or cut in the contact holes, resulting in point defects or the like of the LCD device.

A conventional LCD device, which is termed the first prior art, comprises a TFT array substrate 100 on which TFTs 112 are arranged, as shown in FIGS. 1 and 2. FIG. 1 is a plan view of the TFT array substrate 100 and FIG. 2 is a partial cross-sectional view thereof.

As shown in FIGS. 1 and 2, a patterned conductive gate layer 102 is formed on a transparent insulating plate 101 (i.e., a glass plate). The gate layer 102 is used to form gate lines, gate electrodes 102a, and gate terminals. On the gate layer 102 (i.e., the gate electrodes 102a), a gate insulating layer 103 is formed to cover the gate electrodes 102a. Island-shaped semiconductor layers 104 are formed to overlap with the corresponding gate electrodes 102a. On the semiconductor layers 104, a patterned conductive drain layer 105 is formed. The drain layer 105 is used to form drain lines, drain electrodes 105d, source electrodes 105s, and drain terminals. On the drain layer 105, a passivation layer 106 is formed to protect the underlying layered structure. On the passivation layer 106, a pixel electrode layer 107 as a conductive layer is formed. The pixel electrode layer 107 is used to form pixel electrodes 107a, gate terminals in gate terminal sections 111, and drain terminals in drain terminal sections 113.

The source electrodes 105s of the drain layer 105 are respectively connected to the corresponding pixel electrodes 107a formed by the pixel electrode layer 107 by way of corresponding contact holes 109a in the contact hole sections 109. The contact holes 109a are formed to penetrate the passivation layer 106 by selectively removing the same layer 106, as shown in FIG. 6B.

In the gate terminal sections 111, the passivation layer 106 and the gate insulating layer 103 are selectively removed to form contact holes 114 exposing the gate layer 102 (i.e., the gate terminals), as shown in FIG. 6A. The conductive layer 107 (i.e., the pixel electrode layer), which is located on the passivation layer 106, contacts the underlying gate layer 102 by way of the respective contact holes 114. The conductive layer 107 is connected to external terminals (not shown).

In the drain terminal sections 113, the passivation layer 106 is selectively removed to form contact holes 115 exposing the drain layer 105 (i.e., the drain terminals), as shown in FIG. 6C. The conductive layer 107 (i.e., the pixel electrode layer), which is located on the passivation layer 106, contacts the underlying drain layer 105 (i.e., the drain terminals) by way of the respective contact holes 115. The conductive layer 107 is connected to external terminals (not shown).

The TFTs 112 are formed to overlap with the corresponding island-shaped semiconductor layers 104, as shown in FIG. 2. Each of the TFT 112 comprises the gate electrode 102a formed by the gate layer 102, the drain electrode 105d formed by the drain layer 105, and the source electrode 105s formed by the drain layer 105.

As explained above, the TFT array substrate 100 of the conventional LCD device (i.e., the first prior art) has the above-described structure. In the fabrication method of the TFT array substrate 100, the passivation layer 106 (and the underlying gate insulating layer 103) are selectively removed by dry etching to form the contact holes 109a, 114, and 115, where a patterned photoresist film is used as a mask. In this etching process, the etch rate of the photoresist film is set to be equal to the etch rates of the passivation layer 106 and the gate insulating layer 103. Alternately, the etch rate of the photoresist film is set to be greater than the etch rates of the passivation layer 106 and the gate insulating layer 103. This is to make the photoresist film etched away horizontally during the etching process, thereby forming tapered etching profiles of the contact holes 109a, 114, and 115.

FIG. 3A to FIG. 6C are partial cross-sectional views showing the fabrication process steps of the TFT array substrate 100 of the first prior-art LCD device of FIGS. 1 and 2. FIGS. 3A, 4A, 5A, and 6A show the cross-sectional views of the gate terminal section 111 in FIG. 1 along the line A-A', respectively. FIGS. 3B, 4B, 5B, and 6B show the cross-sectional views of the contact hole section 109 of the TFT 112 in FIG. 1 along the line B-B', respectively. FIGS. 3C, 4C, 5C, and 6C show the cross-sectional views of the drain terminal section 113 in FIG. 1 along the line C-C', respectively.

FIGS. 3A, 3B, and 3C show the state where a patterned photoresist film 108 is formed prior to etching. In this state, the patterned gate layer 102 is formed on the glass plate 101. The gate insulating layer 103 is formed on the plate 101 to cover the gate layer 102. The patterned drain layer 105 is formed on the gate insulating layer 103. The passivation layer 106 is formed on the gate insulating layer 103 to cover the drain layer 105. The photoresist film 108 with a predetermined pattern is formed on the passivation layer 106.

FIGS. 4A, 4B, and 4C show the state after etching under the ordinary etching condition, where the gate terminal section 111, the contact hole section 109, and the drain terminal section 113 are selectively etched using the photoresist film 108. In the gate terminal section 111, as shown in FIG. 4A, the passivation layer 6 and the gate insulating layer 103 are selectively etched to expose the underlying gate layer 2, forming a contact hole 114. In the contact hole section 109 and the drain terminal section 113, as shown in FIGS. 4B and 4C, the passivation layer 6 is selectively etched to expose the underlying drain layer 5, forming contact holes 109a and 115, respectively. All the contact holes 114, 109a, and 115 have tapered etching profiles as desired. In this etching process, the photoresist film 108 also is etched horizontally and vertically, resulting in an etched photoresist film 108a.

FIGS. 5A, 5B, and 5C show the state after etching under the raised (i.e., higher-speed) etching condition. In the gate terminal section 111, as shown in FIG. 5A, the passivation layer 6 and the gate insulating layer 103 are over-etched. In the contact hole section 109 and the drain terminal section 113, as shown in FIGS. 5B and 5C, the passivation layer 6 is over-etched. All the contact holes 114, 109a, and 115 do not have tapered etching profiles as desired. Instead, they have square or inverted tapered profiles. The photoresist film 108 also is etched horizontally and vertically, resulting in an etched photoresist film 108a.

FIGS. 6A, 6B, and 6C show the state after etching under the raised (i.e., higher-speed) etching condition and forming the pixel electrode layer 107 on the passivation layer 106. In the gate terminal section 111, as shown in FIG. 6A, the pixel electrode layer 107 is divided or cut on the inner sidewall of the passivation layer 106. This is because the inner sidewall of the passivation layer 106 is too steep (in other words, the inner sidewall is approximately square or vertical) due to over-etching in the contact hole 114. Similarly, in the contact hole section 109 and the drain terminal section 113, as shown in FIGS. 6B and 6C, the pixel electrode layer 107 is divided or cut on the inner sidewall of the passivation layer 106. This is because the passivation layer 6 has inverted tapered profiles due to over-etching in the contact holes 109a and 115.

As seen from the above explanation when a raised (i.e., higher-speed) dry etching condition is applied to the etching process in fabrication of the first prior-art TFT array substrate 100, the raised etch rate of the photoresist mask 108 is unable to follow the raised etch rates of the passivation layer 106 and the gate insulating layer 103. As a result, the etching profile of the passivation layer 106 is likely to be square or inverted tapered, as shown in FIGS. 5A to 5C.

It is necessary that the pixel electrode layer 107 is placed on the inner sidewalls of the contact hole 114 of the passivation layer 106 and the gate insulating layer 103, and that the layer 107 is electrically connected to the underlying gate layer 102 in the gate terminal section 111. Similarly, the pixel electrode layer 107 needs to be placed on the inner sidewall of the contact hole 109a or 115 of the passivation layer 106, and needs to be electrically connected to the underlying drain layer 105 in the contact hole section 109 or drain terminal section 115. However, the pixel electrode layer 107 is divided or cut, as shown in FIGS. 6A to 6C when a raised dry etching condition is applied. Accordingly, point defects or the like will occur in the first prior-art LCD device.

Next, another prior art is explained below with reference to FIGS. 7 and 8.

A method of forming a tapered etching profile in a dry etching process is disclosed in the Japanese Patent Publication No. 7-312425 published in November 1995, which is termed the second prior art. In this method, a layer constituting a TFT has a multilayer structure comprising two or more sublayers, where the etch rates of the sublayers vary monotonously according to their stacking orders. The etch rate of the sublayer disposed at the highest level is maximum and the etch rate of the sublayer disposed at the lowest level is minimum. The thickness of the sublayer disposed at the lowest level is set in the range from 5% to 20% of the whole thickness of the said layer.

FIGS. 7 and 8 are cross-sectional views of the second prior-art layer with the above-described multiple-layer structure, which show the relationship between the tapered etching profile and the thickness of the two sublayers of the said layer.

As shown in FIG. 7, a layer 220 of a TFT is formed by a lower sublayer 221 and an upper sublayer 222. The lower sublayer 221 is formed on a glass plate 201. The upper sublayer 222 is formed on the lower sublayer 221. The etch rate of the lower sublayer 221 is less than that of the upper sublayer 222. In other words, the lower etch-rate sublayer 221 is disposed on the plate 201, and the higher etch-rate sublayer 222 is disposed on the lower etch-rate sublayer 221.

When the layer 220 with the two-layer structure shown in FIG. 7 is etched by a dry etching process, first, etching of the higher etch-rate sublayer 222 is started. When the etching of the sublayer 222 is completed, etching of the lower etch-rate sublayer 221 is started. Therefore, in the etching process of the lower etch-rate sublayer 221, the higher etch-rate sublayer 222 is over-etched not only vertically but also horizontally. As a result, the higher etch-rate sublayer 222 has a tapered etching profile, in other words, the inner sidewall of the sublayer 222 is tapered, as shown in FIG. 8.

Here, it is important for dry etching that the range of the thickness d1 of the lower etch-rate sublayer 221 to the whole thickness D of the layer 220. Specifically, it is preferred that the thickness d1 is in the range of 5% to 20% of the whole thickness D, because the obtainable taper angle is in the range of 10° to 70°. This means that the relationship between the lower etch-rate sublayer 221 (thickness: d1) and the higher etch-rate sublayer 222 (thickness: d2) is preferably set to satisfy the condition that the thickness d1 is in the range of 5% to 20% of the whole thickness D (=d1+d2).

If the thickness d1 of the lower etch-rate sublayer 221 is greater than 20% of the whole thickness D, the time for etching the lower etch-rate sublayer 221 is too long and therefore, the horizontal etching amount of the higher etch-rate sublayer 222 is too much. In this case, the etching profiled of the sublayer 222 is likely to be inverted tapered.

On the other hand, if the thickness d1 is less than 5% of the whole thickness D, the time for etching the lower etch-rate sublayer 221 is too short and therefore, the horizontal etching amount of the higher etch-rate sublayer 222 is insufficient. In this case, the etching profiled of the sublayer 222 is unlikely to have a desired tapered angle.

For wet etching, similarly, it is preferred that the thickness d1 of the lower etch-rate sublayer 221 is in the range of 50% to 90% of the whole thickness D. In addition, the taper angle of the tapered etching profile is controllable by changing the thickness ratio (d2/d1) between the lower etch-rate sublayer 221 and upper etch-rate sublayer 222, the etch rate ratio thereof, and the etching condition.

As explained above, with the first prior art TFT array substrate 100 shown in FIG. 1 to FIG. 6C, when a raised (i.e., higher-speed) dry etching condition is applied to the dry etching process in fabrication of the substrate 100, the raised etch rate of the photoresist mask 108 is unable to follow the raised etch rates of the passivation layer 106 and the gate insulating layer 103. As a result, the etching profile of the passivation layer 106 is likely to be square or inverted tapered. Accordingly, the pixel electrode layer 107, which is disposed on the passivation layer 106 and electrically connected to the gate layer 102 or the drain layer 105, tends to be divided or cut, resulting in a problem of point defects or the like of the LCD device.

With the second prior art shown in FIGS. 7 and 8, when the second prior-art method is applied to the formation of the passivation layer 106, the thickness ratio of the higher etch rate sublayer (which means its coarse quality) to the whole thickness of the passivation layer 106 will be large. Therefore, there is a problem that the protection function (e.g., moisture proof) of the passivation layer 106 itself degrades. To obtain a sufficient protection effect, the whole thickness of the passivation layer 106 may be increased. If so, however, another problem that the throughput of the layer formation (deposition) and etching apparatuses reduces will occur.

In addition, as described above, the second prior art discloses an application to wet etching, where the thickness d1 of the lower etch-rate sublayer 221 is preferably set in the range of 50% to 90% of the whole thickness D. However, if wet etching is used, the contact hole is likely to be expanded due to side etching by an impregnated etching solution to a gap between the photoresist film 108 and the passivation layer 106 when the adhesion strength (i.e., close contact) between the photoresist film 108 and the passivation layer 106 is insufficient locally or entirely. For example, if an etching solution seeps to the outside of the drain electrode 105d, the underlying gate insulating layer 103 is etched, thereby unsticking the drain layer 105 from the gate insulating layer 103.

Furthermore, if a damaged area (e.g., a damaged area caused by plasma in the dry etching process for the channel region of the TFT 112) is formed through an intermediate process at the interface between the passivation layer 106 and the gate insulating layer 103, the etching profile of the passivation layer 106 is likely to be inverted tapered due to side etching in the damaged area when a wet etching is used. Accordingly, the conductive layer (i.e., the pixel electrode layer 107) formed on the passivation layer 106 tends to be divided.

In recent years, according to the expanding substrate size, etch uniformity control in the existing wet etching apparatuses has become difficult. At the same time, there is a danger that liquid medicines such as hydrofluoric (HP) acid need to be used in large quantities in wet etching. In addition, since an obtainable etch rate in wet etching is extremely lower than that in dry etching, the use of wet etching has decreased for etching the passivation layer 106 and the gate insulating layer 103.

SUMMARY OF THE INVENTION

The present invention was created in consideration of the above-described problems and the recent circumstances.

An object of the present invention is to provide a TFT, a TFT array substrate, and a LCD device that make it possible to control the etching profile in an etching process of the passivation layer and the gate insulating layer, thereby preventing the conductive layer on the passivation layer from being divided or cut, and methods of fabricating them.

The above object together with others not specifically mentioned will become clear to those skilled in the art from the following description.

According to a first aspect of the present invention, a TFT is provided, which comprises a gate layer, a gate insulating layer, a semiconductor layer, a drain layer, and a passivation layer, each of which is formed on or over an insulating substrate; and a conductive layer formed on the passivation layer, the conductive layer being connected to the gate layer or the drain layer by way of a contact hole penetrating at least the passivation layer;

wherein the passivation layer has a multiple-layer structure comprising at least a first sublayer and a second sublayer stacked;

the first sublayer has an etch rate lower than that of the second sublayer;

the first sublayer is disposed closer to the substrate than the second sublayer; and the second sublayer has a thickness equal to or less than that of the conductive layer.

With the TFT according to the first aspect of the present invention, the passivation layer has a multiple-layer structure comprising at least the first sublayer and the second sublayer stacked. The first sublayer has an etch rate lower than that of the second sublayer and is disposed closer to the substrate than the second sublayer. Therefore, even if the etch rates of the first and second sublayers are greater than the etch rate of a mask (e.g., a patterned photoresist film), the second sublayer with an etch rate higher than that of the first sublayer is side-etched. As a result, the etching profile of the first sublayer will be tapered.

Moreover, since the thickness of the second sublayer is equal to or less than the thickness of the conductive layer (e.g., a pixel electrode layer), even if the etching profile of the second sublayer is square or inverted tapered, the conductive layer will not be divided or cut.

Accordingly, the etching profile in the etching process of the passivation layer and the gate insulating layer can be controlled as desired. Thus, the conductive layer on the passivation layer is prevented from being divided or cut.

In a preferred embodiment of the TFT according to the first aspect of the present invention, the passivation layer is made of silicon nitride (SiN).

In another preferred embodiment of the TFT according to the first aspect of the present invention, the etch rate of the second sublayer of the passivation layer made of SiN is 1.1 times as much as that of the first sublayer thereof, or greater.

In still another preferred embodiment of the TFT according to the first aspect of the present invention, a ratio of a N atom count bonded to a H atom to a Si atom count bonded to a H atom (N—H/Si—H) of the second sublayer of the passivation layer made of SiN is 2.3 times as much as that of the first sublayer thereof, or greater.

In a further preferred embodiment of the TFT according to the first aspect of the present invention, a composition ratio of N to Si (a N/Si ratio) of the second sublayer of the passivation layer made of SiN is 1.7 times as much as that of the first sublayer thereof, or greater.

In a still further preferred embodiment of the TFT according to the first aspect of the present invention, the substrate is made of a transparent insulating material, the gate insulating layer is made of SiN, the conductive layer is made of indium tin oxide (ITO), the gate layer has a single or multiple layer structure comprising at least one metal or alloy sublayer, and the drain layer has a single or multiple layer structure comprising at least one metal or alloy sublayer.

According to a second aspect of the present invention, a TFT array substrate is provided. This substrate comprises the TFTs according to the first aspect of the present invention.

According to a third aspect of the present invention, a LCD device is provided. This device comprises the TFT array substrate according to the second aspect of the present invention.

According to a fourth aspect of the present invention, a method of fabricating a TFT is provided, where the TFT comprises a gate layer, a gate insulating layer, a semiconductor layer, a drain layer, and a passivation layer, each of which is formed on or over an insulating substrate; and a conductive layer formed on the passivation layer, the conductive layer being connected to the gate layer or the drain layer by way of a contact hole penetrating at least the passivation layer.

This method comprises the steps of:

forming a first sublayer of the passivation layer over the substrate;

forming a second sublayer of the passivation layer on the first sublayer, the second sublayer having an etch rate higher than that of the first sublayer;

selectively etching the second sublayer and the first sublayer using a mask, thereby forming the contact hole penetrating at least the passivation layer; and forming the conductive layer to cover the contact hole, thereby contacting the conductive layer with the gate layer or the drain layer by way of the contact hole;

wherein the second sublayer has a thickness equal to or less than that of the conductive layer.

With the method of fabricating a TFT according to the fourth aspect of the present invention, the first sublayer is formed over the substrate and then, the second sublayer having a higher etch rate than that of the first sublayer is formed on the first sublayer. Thus, the passivation layer has a multiple-layer structure comprising at least the first sublayer and the second sublayer stacked. Thereafter, the second sublayer and the first sublayer are selectively etched using the mask, thereby forming the contact hole penetrating at least the passivation layer. Therefore, even if the etch rates of the first and second sublayers are greater than the etch rate of the mask (e.g., a patterned photoresist film), the second sublayer with an etch rate higher than that of the first sublayer is side-etched in this etching step. As a result, the etching profile of the first sublayer will be tapered.

Subsequently, the conductive layer is formed to cover the contact hole, thereby contacting the conductive layer with the gate layer or drain layer by way of the contact hole. The second sublayer has a thickness equal to or less than that of the conductive layer. Therefore, even if the etching profile of the second sublayer is square or inverted tapered in the above etching step, the conductive layer will not be divided or cut.

Accordingly, the etching profile in the etching process of the passivation layer and the gate insulating layer can be controlled as desired. Thus, the conductive layer on the passivation layer is prevented from being divided or cut.

In a preferred embodiment of the method according to the fourth aspect of the present invention, the passivation layer is formed by silicon nitride (SiN).

In another preferred embodiment of the method according to the fourth aspect of the present invention, the etch rate of the second sublayer of the passivation layer made of SiN is 1.1 times as much as that of the first sublayer, or greater in the step of selectively etching the second sublayer and the first sublayer.

In still another preferred embodiment of the method according to the fourth aspect of the present invention, a ratio of a N atom count bonded to a H atom to a Si atom count bonded to a H atom (N—H/Si—H) of the second sublayer of the passivation layer made of SiN is 2.3 times as much as that of the first sublayer thereof, or greater.

In a further preferred embodiment of the method according to the fourth aspect of the present invention, a composition ratio of N to Si (a N/Si ratio) of the second sublayer of the passivation layer made of SiN is 1.7 times as much as that of the first sublayer thereof, or greater.

In a still further preferred embodiment of the method according to the fourth aspect of the present invention, the first sublayer and the second sublayer of the passivation layer made of SiN are formed in a same chamber.

In a still further preferred embodiment of the method according to the fourth aspect of the present invention, the first sublayer and the second sublayer of the passivation layer made of SiN are formed in plural chambers.

In a still further preferred embodiment of the method according to the fourth aspect of the present invention, the step of selectively etching the second sublayer and the first sublayer of the passivation layer is carried out by dry etching.

In a still further preferred embodiment of the method according to the fourth aspect of the present invention, the etch rate of the passivation layer made of SiN is 1.1 times as much as that of the mask, or greater in the step of selectively etching the passivation layer made of SiN.

In a still further preferred embodiment of the method according to the fourth aspect of the present invention, the etch rate of the passivation layer made of SiN is controlled by adjusting a flow rate of a reaction gas for a plasma-enhanced chemical vapor deposition (CVD) process.

According to a fifth aspect of the present invention, a method of fabricating a TFT array substrate is provided. This method uses the method of fabricating a TFT according to the fourth aspect of the present invention.

According to a sixth aspect of the present invention, a method of fabricating a LCD device is provided. This method uses the method of fabricating a TFT array substrate according to the fifth aspect of the present invention.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
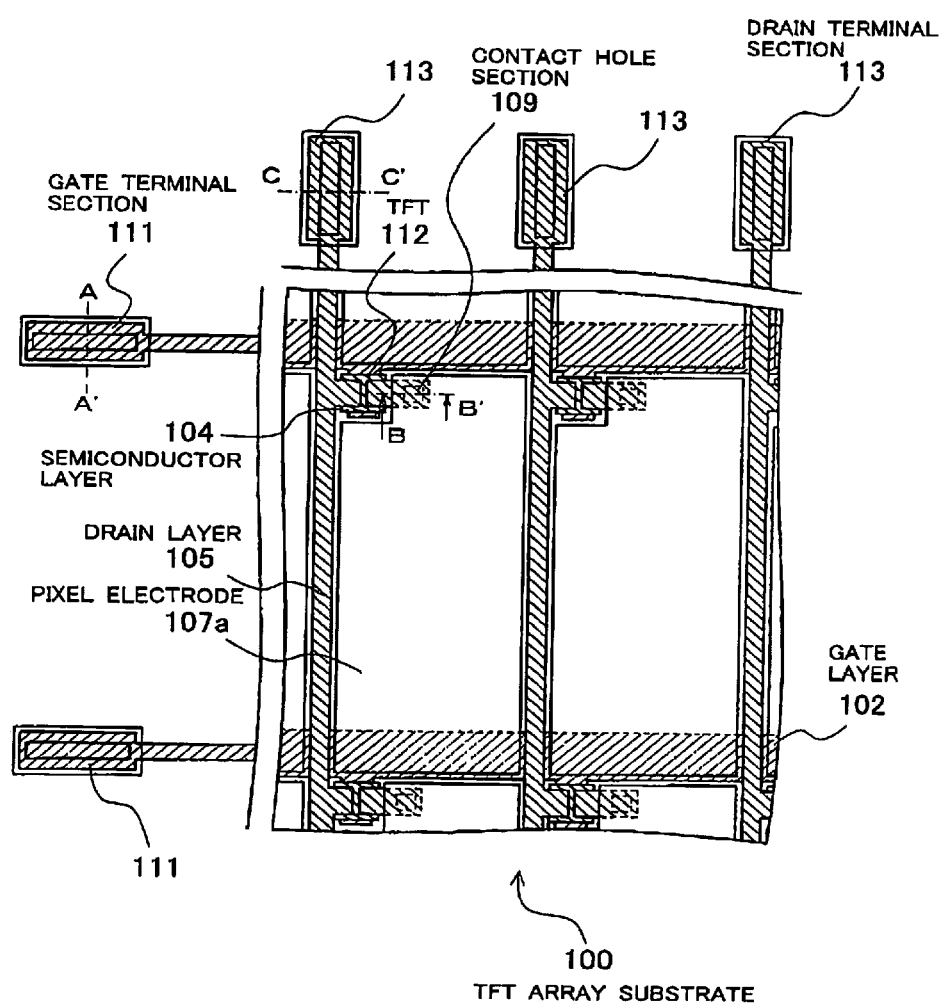
FIG. 1 is a plan view of the TFT array substrate of the first prior-art LCD device.
Figure 2:
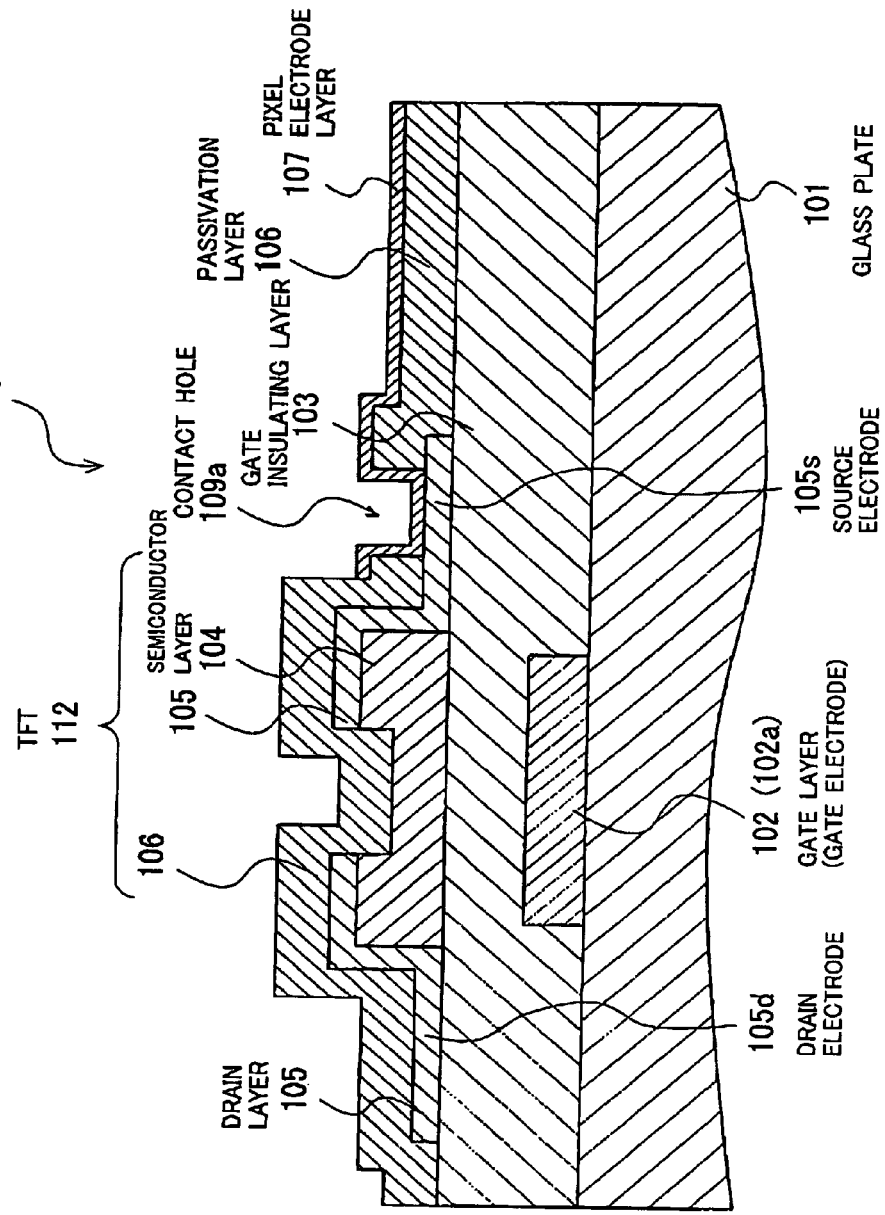
FIG. 2 is a partial cross-sectional view of the TFT array substrate of the first prior-art LCD device.
Figure 3:
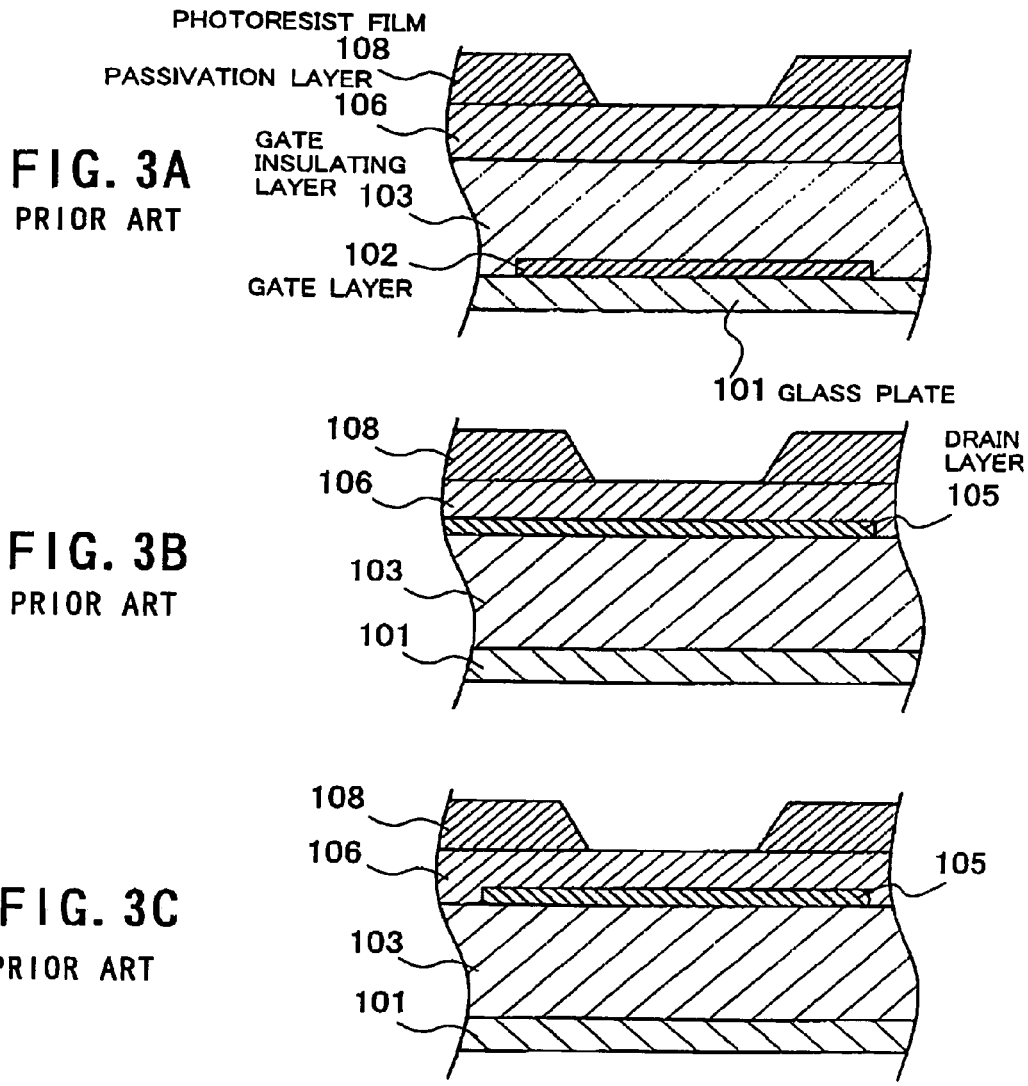
FIG. 3A is a cross-sectional view of the gate terminal section along the line A-A' in FIG. 1 prior to the etching process, which shows the fabrication process steps of the first prior-art TFT array substrate of FIGS. 1 and 2.
FIG. 3B is a cross-sectional view of the contact hole section of the TFT along the line B-B' in FIG. 1 prior to the etching process, which shows the fabrication process steps of the first prior-art TFT array substrate of FIGS. 1 and 2.
FIG. 3C is a cross-sectional view of the drain terminal section along the line C-C' in FIG. 1 prior to the etching process, which shows the fabrication process steps of the first prior-art TFT array substrate of FIGS. 1 and 2.
Figure 4:
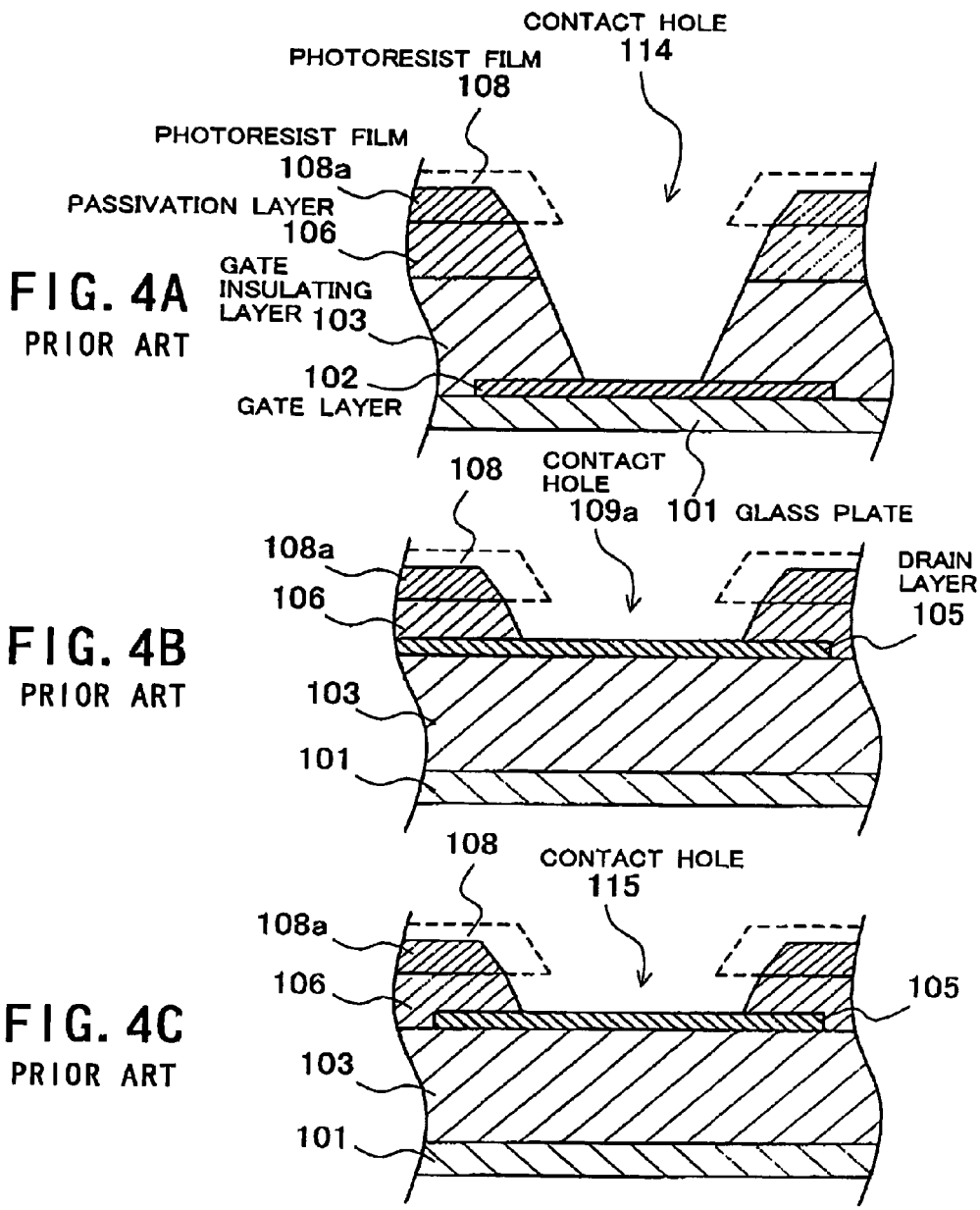
FIG. 4A is a cross-sectional view of the gate terminal section along the line A-A' in FIG. 1 after the etching process under an ordinary etching condition, which shows the fabrication process steps of the first prior-art TFT array substrate of FIGS. 1 and 2.
FIG. 4B is a cross-sectional view of the contact hole section of the TFT along the line B-B' in FIG. 1 after the etching process under an ordinary etching condition, which shows the fabrication process steps of the first prior-art TFT array substrate of FIGS. 1 and 2.
FIG. 4C is a cross-sectional view of the drain terminal section along the line C-C' in FIG. 1 after the etching process under an ordinary etching condition, which shows the fabrication process steps of the first prior-art TFT array substrate of FIGS. 1 and 2.
Figure 5:
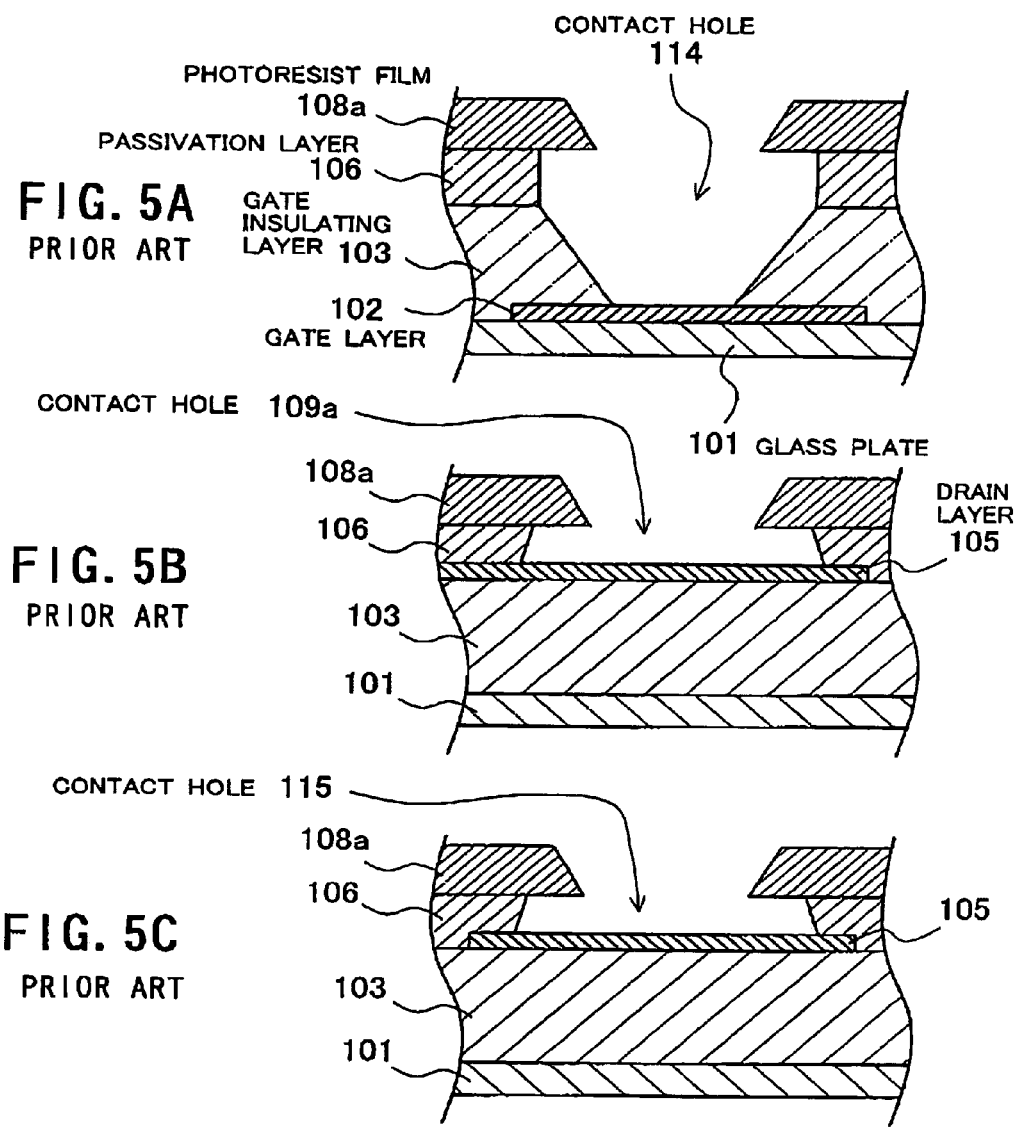
FIG. 5A is a cross-sectional view of the gate terminal section along the line A-A' in FIG. 1 after the etching process under a higher-speed (i.e., raised) etching condition, which shows the fabrication process steps of the first prior-art TFT array substrate of FIGS. 1 and 2.
FIG. 5B is a cross-sectional view of the contact hole section of the TFT along the line B-B' in FIG. 1 after the etching process under a higher-speed (i.e., raised) etching condition, which shows the fabrication process steps of the first prior-art TFT array substrate of FIGS. 1 and 2.
FIG. 5C is a cross-sectional view of the drain terminal section along the line C-C' in FIG. 1 after the etching process under a higher-speed (i.e., raised) etching condition, which shows the fabrication process steps of the first prior-art TFT array substrate of FIGS. 1 and 2.
Figure 6:
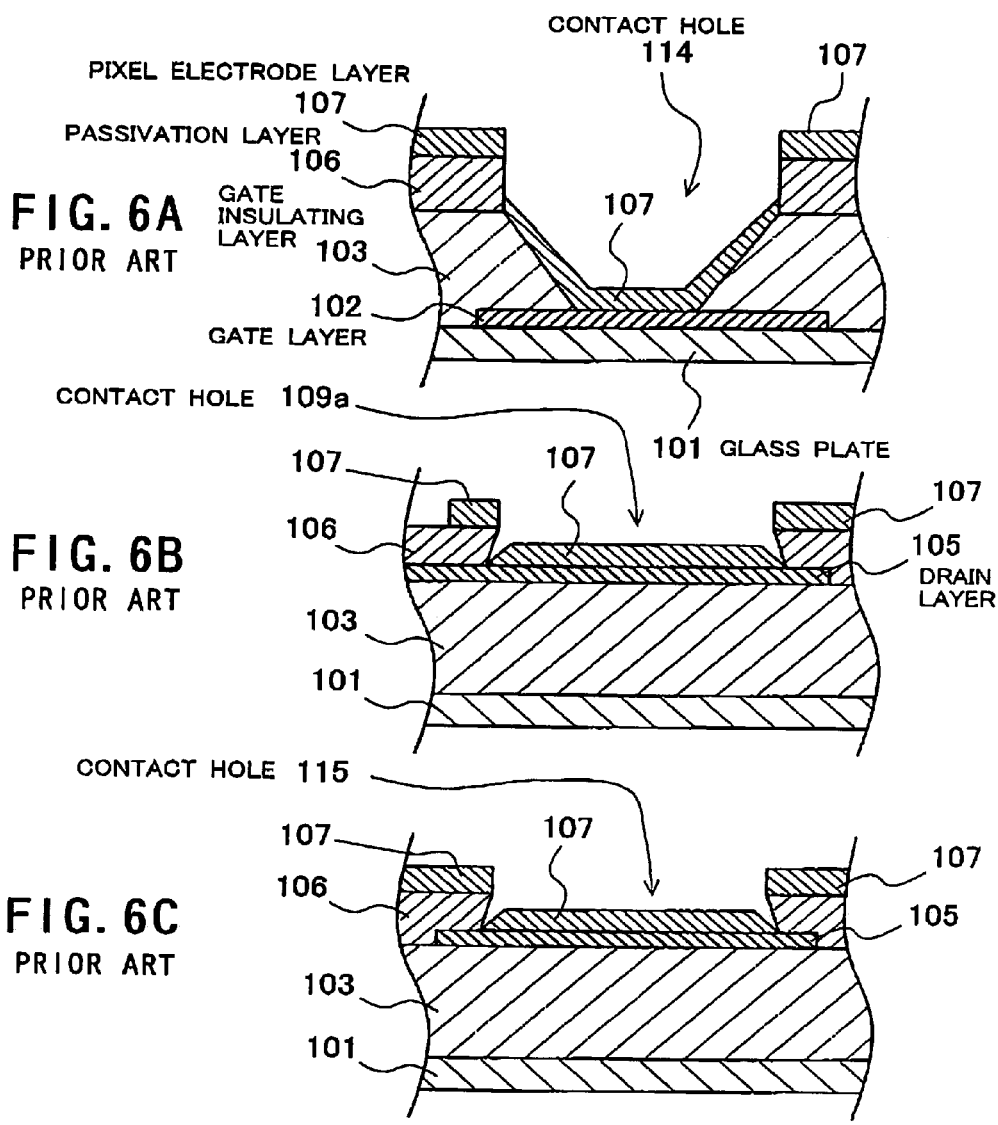
FIG. 6A is a cross-sectional view of the gate terminal section along the line A-A' in FIG. 1 after the etching process under a higher-speed (i.e., raised) etching condition and the formation process of the pixel electrode layer on the passivation layer, which shows the fabrication process steps of the first prior-art TFT array substrate of FIGS. 1 and 2.
FIG. 6B is a cross-sectional view of the contact hole section of the TFT along the line B-B' in FIG. 1 after the etching process under a higher-speed (i.e., raised) etching condition and the formation process of the pixel electrode layer on the passivation layer, which shows the fabrication process steps of the first prior-art TFT array substrate of FIGS. 1 and 2.
FIG. 6C is a cross-sectional view of the drain terminal section along the line C-C' in FIG. 1 after the etching process under a higher-speed (i.e., raised) etching condition and the formation process of the pixel electrode layer on the passivation layer, which shows the fabrication process steps of the first prior-art TFT array substrate of FIGS. 1 and 2.
Figure 7:
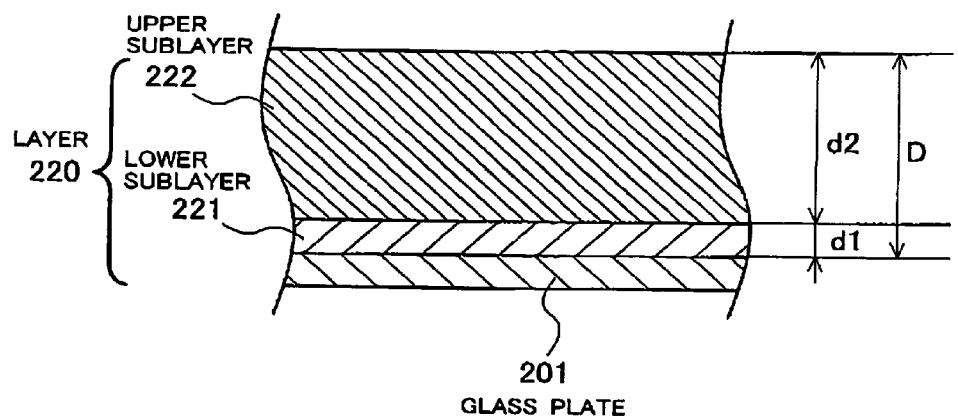
FIG. 7 is a partial cross-sectional view of the layer having a multiple-layer structure of the second prior-art method prior to the etching process.
Figure 8:
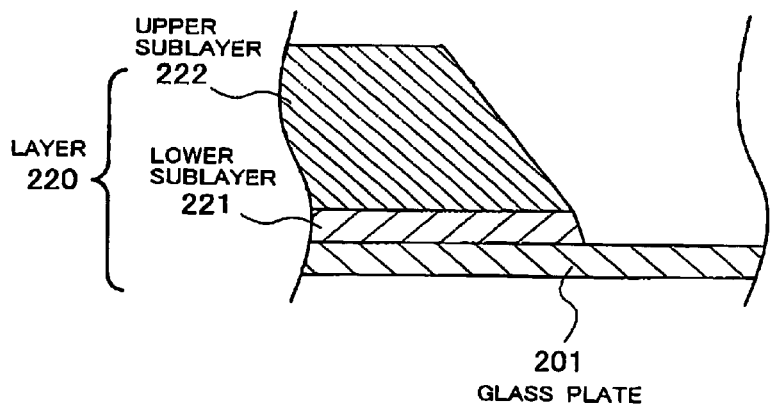
FIG. 8 is a partial cross-sectional view of the layer having a multiple-layer structure of the second prior-art method after the etching process.

Preferred embodiments of the present invention will be described in detail below while referring to the drawings attached.

First Embodiment

Figure 9:
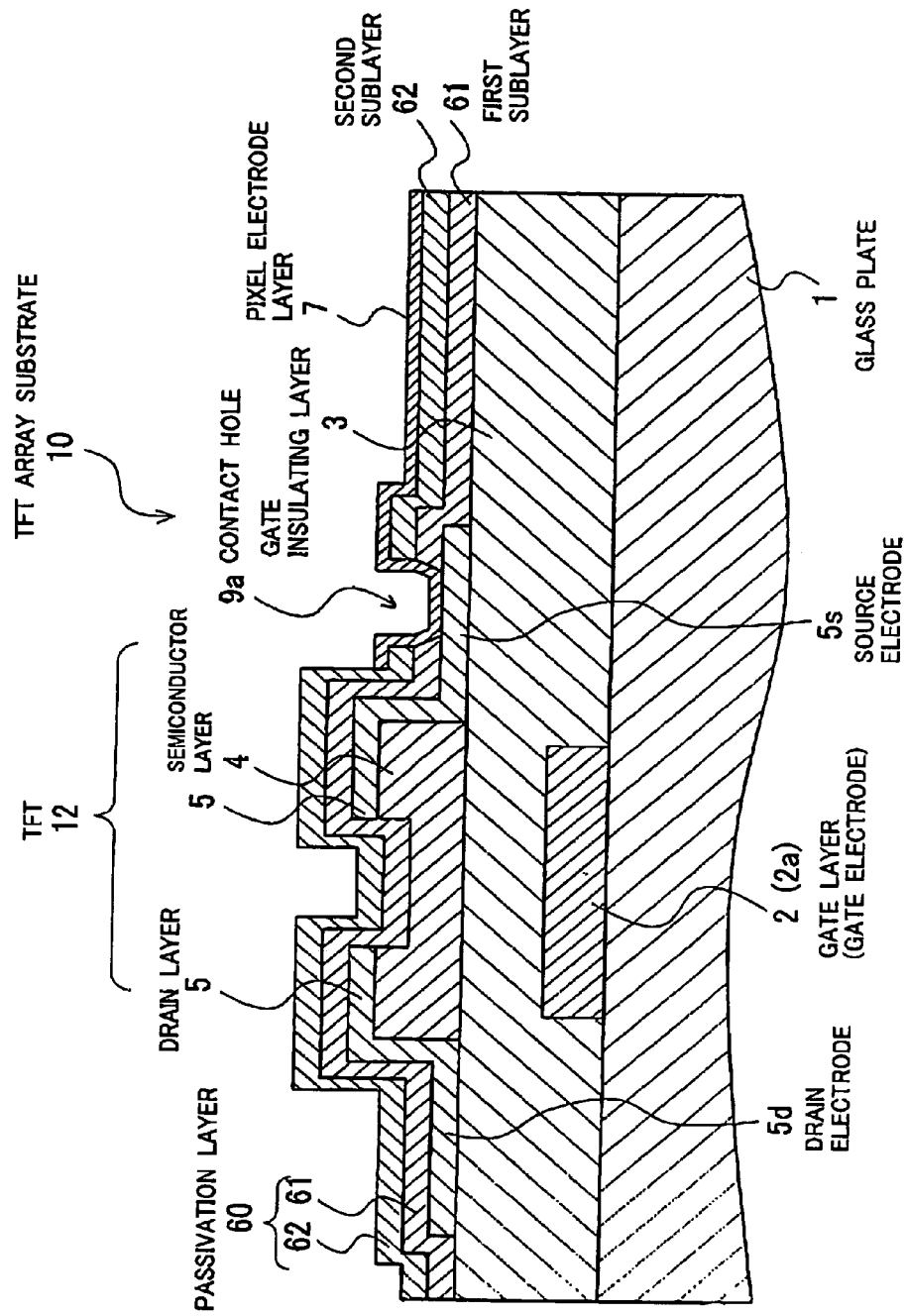
FIG. 9 is a partial cross-sectional view of a TFT array substrate according to a first embodiment of the present invention.
Figure 13:
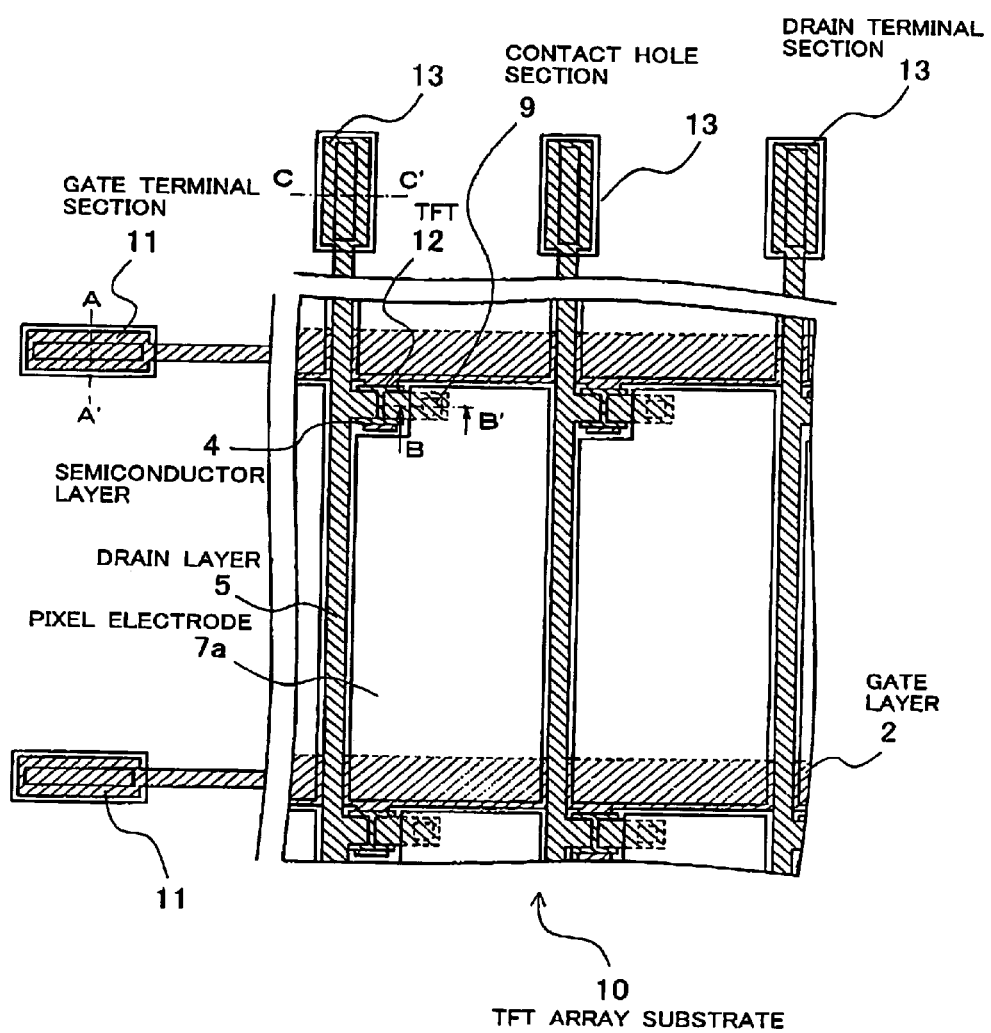
FIG. 13 is a plan view of the TFT array substrate according to the first embodiment of the present invention.

FIG. 9 schematically shows the structure of a TFT array substrate 10 of a LCD device according to a first embodiment of the present invention. FIG. 13 schematically shows a plan view of the substrate 10 according to the first embodiment, which is substantially the same as that of FIG. 1.

As shown in FIGS. 9 and 13, a patterned conductive gate layer 2 is formed on a transparent insulating plate 1 (e.g., a glass plate). The gate layer 2 is used to form gate lines, gate electrodes 2a, and gate terminals. On the gate layer 2 (i.e., the gate electrodes 2a), a gate insulating layer 3 is formed to cover the gate electrodes 2a. Island-shaped semiconductor layers 4 are formed on the gate insulating layer 3 to overlap with the corresponding gate electrodes 2a. On the semiconductor layers 4, a patterned conductive drain layer 5 is formed. The drain layer 5 is used to form drain lines, drain electrodes 5d, source electrodes 5s, and drain terminals. On the drain layer 5, a passivation layer 60 is formed to protect the underlying layered structure. On the passivation layer 60, a pixel electrode layer 7 as a conductive layer is formed. The pixel electrode layer 7 is used to form pixel electrodes 7a, gate terminals in gate terminal sections 11, and drain terminals in drain terminal sections 13.

The source electrodes 5s of the drain layer 5 are respectively connected to the corresponding pixel electrodes 7a by way of corresponding contact holes 9a provided in the contact hole sections 9. The contact holes 9a are formed to penetrate the passivation layer 60 by selectively removing the same layer 60, as shown in FIG. 12B.

Figure 12:
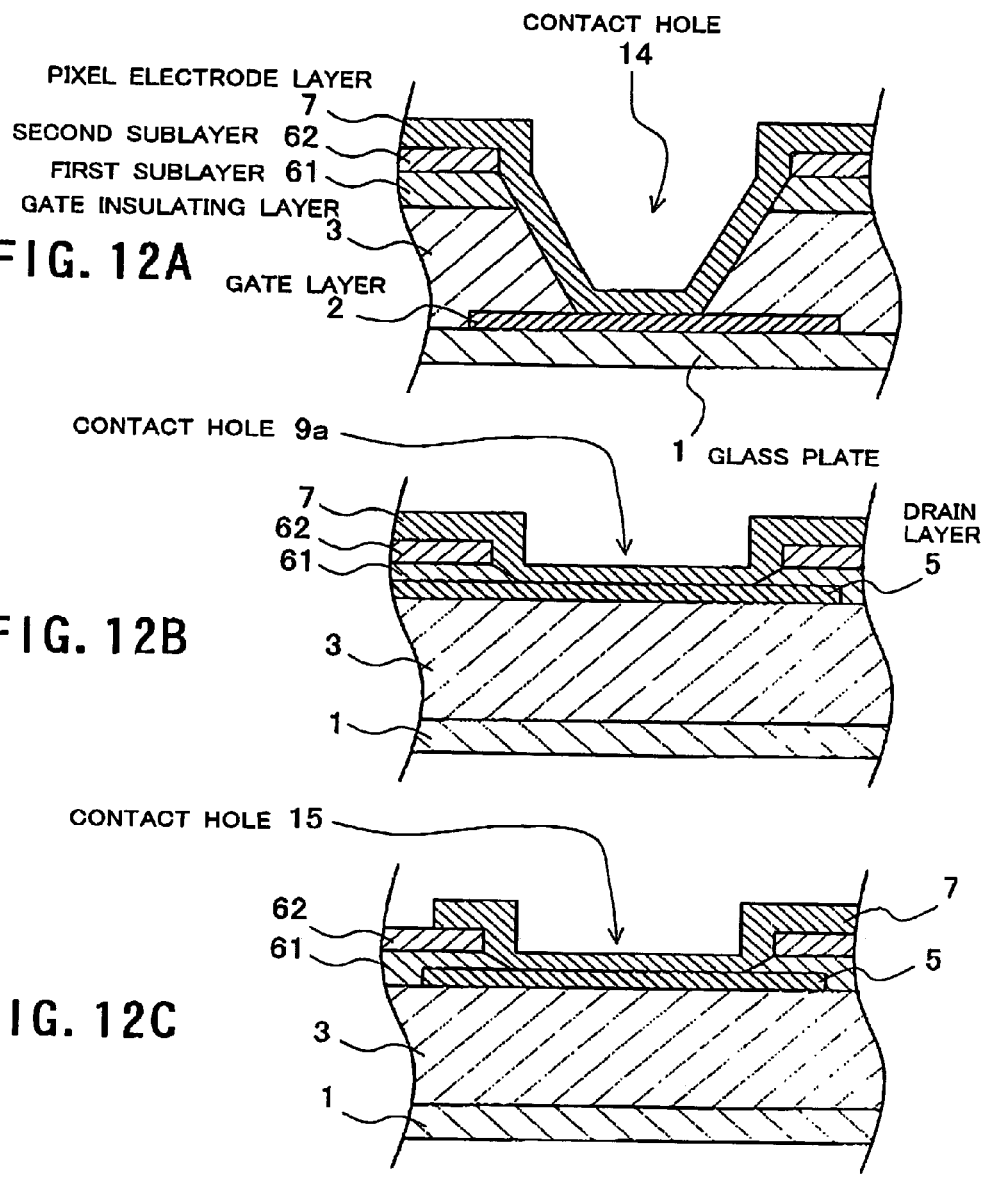
FIG. 12A is a cross-sectional view of the gate terminal section along the line A-A' in FIG. 13 after the etching process and the formation process of the pixel electrode layer on the passivation layer, which shows the fabrication process steps of the TFT array substrate according to the first embodiment of the present invention of FIG. 9.
FIG. 12B is a cross-sectional view of the contact hole section of the TFT along the line B-B' in FIG. 13 after the etching process and the formation process of the pixel electrode layer on the passivation layer, which shows the fabrication process steps of the TFT array substrate according to the first embodiment of the present invention of FIG. 9.
FIG. 12C is a cross-sectional view of the drain terminal section along the line C-C' in FIG. 13 after the etching process and the formation process of the pixel electrode layer on the passivation layer, which shows the fabrication process steps of the TFT array substrate according to the first embodiment of the present invention of FIG. 9.

In the gate terminal sections 11, the passivation layer 60 and the gate insulating layer 3 are selectively removed to form contact holes 14 exposing the gate layer 2 (i.e., the gate terminals), as shown in FIG. 12A. The conductive layer (i.e., the pixel electrode layer) 7, which is located on the passivation layer 60, contacts the underlying gate layer 2 by way of the respective contact holes 14. The conductive layer 7 is connected to external terminals (not shown).

In the drain terminal sections 13, the passivation layer 60 is selectively removed to form contact holes 15 exposing the drain layer 5 (i.e., the drain terminals), as shown in FIG. 12C. The conductive layer 7 (i.e., the pixel electrode layer), which is located on the passivation layer 60, contacts the underlying drain layer 5 (i.e., the drain terminals) by way of the respective contact holes 15. The conductive layer 7 is connected to external terminals (not shown).

The TFTs 12 are formed to overlap with the corresponding island-shaped semiconductor layers 4, as shown in FIG. 9. Each of the TFT 12 comprises the gate electrode 2a formed by the gate layer 2, the drain electrode 5d formed by the drain layer 5 and the source electrode 5s formed by the drain layer 5.

The passivation layer 60 has a two-layer structure comprising a first sublayer 61 with a lower etch rate and a second sublayer 62 with a higher etch rate. The first sublayer 61 may be termed the lower etch-rate sublayer and the second is sublayer 62 may be termed the higher etch-rate sublayer below. The thickness of the higher etch-rate sublayer 62 is equal to or less than the thickness of the pixel electrode layer 7. Here, the lower etch-rate sublayer 61 and the higher etch-rate sublayer 62 are made of the same material, e.g., silicon nitride (SiN).

With the TFT 12, the passivation layer 60 is formed by the lower etch-rate sublayer (i.e., the first sublayer) 61 disposed close to the plate 1 and the higher etch-rate sublayer (i.e., the second sublayer) 62 disposed close to the surface of the substrate 10, in other words, disposed distant from the plate 1. Therefore, the etching profile of the passivation layer 60 and the underlying gate insulating layer 3 can be controlled as desired.

Moreover, the thickness of the higher etch-rate sublayer 62 disposed at the top of the passivation layer 60 is equal to or less than the thickness of the overlying pixel electrode layer 7. Therefore, even if the etching profile of the higher etch-rate sublayer 62 is square (i.e., vertical) or inverted tapered, the overlying pixel electrode layer 7 is prevented from being divided or cut.

In addition, the higher etch-rate sublayer 62, which is the coarsest material, is disposed at the top of the passivation layer 60. The thickness of the sublayer 62 is equal to or less than the thickness of the overlying pixel electrode layer 7. Therefore, the protection function (e.g., moisture proof) of the overall passivation layer 6 is prevented from degrading.

It is sufficient that the etch rate of the higher etch-rate sublayer (i.e., the second sublayer) 62 of the passivation layer 60 is 1.1 times as much as that of the lower etch-rate sublayer (i.e., the first sublayer) 61, or greater. It is sufficient that the ratio (N—H/Si—H) of the N atom count (N—H) bonded to H atom to the Si atom count (Si—H) bonded to H atom of the higher etch-rate sublayer 62 is 2.3 times as much as the ratio (N—H/Si—H) of the lower etch-rate sublayer 61, or greater. It is sufficient that the composition ratio of N to Si (i.e., the N/Si ratio) of the higher etch-rate sublayer 62 is 1.7 times as much as the N/Si ratio of the lower etch-rate sublayer 61, or greater.

It may be said that the TFT array substrate 10 according to the first embodiment of the invention comprises the TFTs 12 with the above-described structure. A LCD device according to the first embodiment of the invention comprises the TFT array substrate 10.

With the TFT 12 according to the first embodiment of the present invention, as explained above, the passivation layer 60 has a two-layer structure comprising at least the higher etch-rate sublayer 62 and the lower etch-rate sublayer 61 stacked. The first sublayer 61 has a lower etch rate than the second sublayer 62 and is disposed closer to the plate 10 than the second sublayer 62. The second sublayer 62 has a thickness equal to or less than that of the pixel electrode layer 7 (i.e., the conductive layer).

Accordingly, the etching profile in the dry etching process of the passivation layer 60 and the gate insulating layer 3 can be controlled as desired. Concretely speaking, the etching profile of the lower etch-rate sublayer 61 is tapered due to side etching of the higher etch-rate sublayer 62. As a result, the etch rate may be raised by changing the etching condition in the dry etching process of the passivation layer 60 to raise the production capacity of the etching apparatus. If so, the pixel electrode layer 7 on the passivation layer 60 is prevented from being divided or cut.

In this case, even if the etch rates of the passivation layer 60 and the gate insulating layer 3 are greater than the etch rate of the photoresist film 8, the etching profile of the lower etch-rate sublayer 61 will be tapered due to side etching of the higher etch-rate sublayer 62.

Although the passivation layer 60 has a two-layer structure comprising the lower etch-rate sublayer 61 and the higher etch-rate sublayer 62, the present invention is not limited to this structure. It is sufficient for the present invention that (i) the passivation layer 60 has a multiple-layer structure comprising two or more sublayers (e.g., the first and second sublayers 61 and 62), (ii) the etch rates of the sublayers decrease from the top sublayer (e.g., the second sublayer 62) disposed at the top of the layer 60 to the bottom sublayer (e.g., the first sublayer 61) disposed at the bottom thereof, (iii) the etch rate of the next sublayer (e.g., the first sublayer 61) of the passivation layer 60 next to the top sublayer (e.g., the second sublayer 62) is 1.1 times as much as that of the top sublayer, or greater, and (iv) the top sublayer (e.g., the second sublayer 62) has a thickness equal to or less than that of the pixel electrode layer 7.

Figure 10:
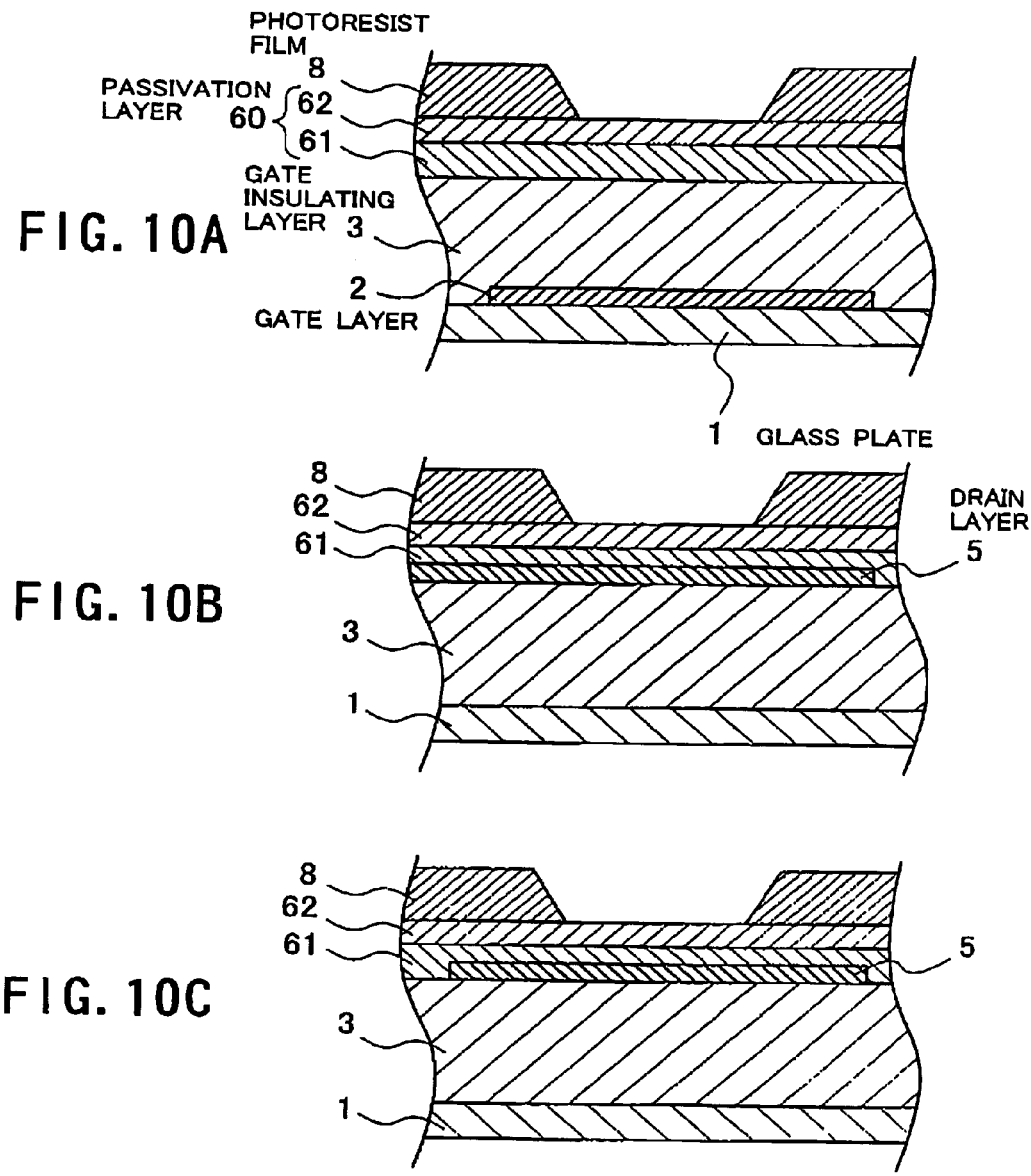
FIG. 10A is a cross-sectional view of the gate terminal section along the line A-A' in FIG. 13 prior to the etching process, which shows the fabrication process steps of the TFT array substrate according to the first embodiment of the present invention of FIG. 9.
FIG. 10B is a cross-sectional view of the contact hole section of the TFT along the line B-B' in FIG. 13 prior to the etching process, which shows the fabrication process steps of the TFT array substrate according to the first embodiment of the present invention of FIG. 9.
FIG. 10C is a cross-sectional view of the drain terminal section along the line C-C' in FIG. 13 prior to the etching process, which shows the fabrication process steps of the TFT array substrate according to the first embodiment of the present invention of FIG. 9.
Figure 11:
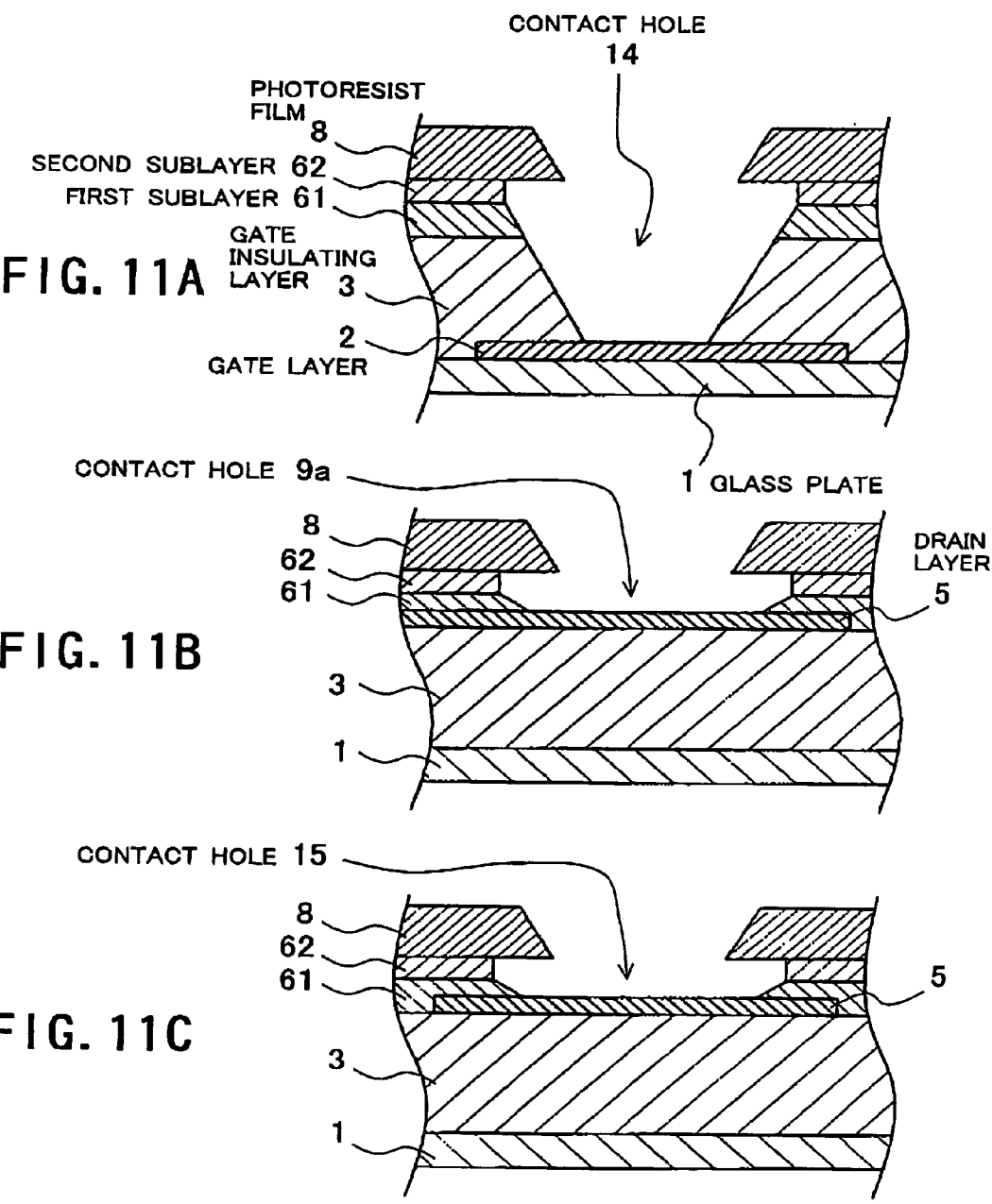
FIG. 11A is a cross-sectional view of the gate terminal section along the line A-A' in FIG. 13 after the etching process, which shows the fabrication process steps of the TFT array substrate according to the first embodiment of the present intention of FIG. 9.
FIG. 11B is a cross-sectional view of the contact hole section of the TFT along the line B-B' in FIG. 13 after the etching process, which shows the fabrication process steps of the TFT array substrate according to the first embodiment of the present invention of FIG. 9.
FIG. 11C is a cross-sectional view of the drain terminal section along the line C-C' in FIG. 13 after the etching process, which shows the fabrication process steps of the TFT array substrate according to the first embodiment of the present invention of FIG. 9.

Next, a method of fabricating the TFT array substrate 10 according to the first embodiment of the invention will be explained below with reference to FIGS. 10A to 10C to FIGS. 12A to 12C. FIGS. 10A to 10C show the state prior to the etching of the passivation layer 60 and the gate insulating layer 3. FIGS. 11A to 11C show the state after the etching of the passivation layer 60 and the gate insulating layer 3. FIGS. 12A to 12C show the state after forming the pixel electrode layer 7.

First, an aluminum (Al) layer and a molybdenum (Mo) layer are formed in this order on the transparent insulating plate (e.g., the glass plate) 1 by sputtering. Then, by a photolithography process and a wet etching process using a mixture of phosphoric acid ($H_3PO_4$), nitric acid ($HNO_3$), and acetic acid ($CH_3COOH$), the Al layer and the Mo layer are selectively etched, thereby forming the patterned gate layer 2 on the plate 1. The gate layer 2 includes the gate lines, the gate electrodes 2a, and the gate terminals.

Subsequently, by plasma-enhanced CVD, a SiN layer for the gate insulating layer 3, an amorphous silicon (a-Si) layer, and an n-type a-Si layer ($n^+$ a-Si) doped with phosphorus (P) are formed in this order on the plate 1. Thereafter, by a photolithography process and a dry etching process using fluorine halogenide, the $n^+$ a-Si layer and the a-Si layer are selectively etched, thereby forming the island-shaped semiconductor layers 4 by the stacked $n^+$ a-Si and a-Si layers on the gate insulating layer 3 made of SiN.

Next, an Indium tin oxide (ITO) layer is formed by sputtering. Then, by a photolithography process and a wet etching process using a mixture of $H_3PO_4$, $HNO_3$, and $CH_3COOH$, the ITO layer is selectively etched, thereby forming the patterned drain layer 4. The drain layer 4 includes the drain lines, the drain electrodes 5d, the source electrodes 5s, and the drain terminals. Subsequently, by a dry etching process using fluorine halogenide, the $n^+$ a-Si layer is selectively removed between the drain electrodes 5d and the source electrodes 5s, thereby forming the channel regions.

Next, as shown in FIGS. 10A to 10C, by plasma-enhanced CVD, the lower etch-rate sublayer (i.e., the first sublayer) 61 and the higher etch-rate sublayer (i.e., the second sublayer) 62 are formed by SiN in this order on the gate insulating layer 3 to cover the semiconductor layers 4 and the drain layer 5. Thereafter, as shown in FIGS. 11A to 11C, by a photolithography process and a dry etching process using fluorine halogenide, the lower etch-rate sublayer 61 and the higher etch-rate sublayer 62 are selectively etched, thereby forming the contact holes 14, 9a, and 15 in the gate terminal section 11, the contact hole section 9, and the drain terminal section 13, respectively. In the gate terminal section 11, the underlying gate layer 2 is exposed through the contact hole 14. In the contact hole section 9, the underlying drain layer 5 is exposed through the contact hole 9a. In the drain terminal section 13, the underlying drain layer 5 is exposed through the contact hole 15.

Here, the passivation layer 60 is formed by the lower etch-rate sublayer (i.e., the first sublayer) 61 and the higher etch-rate sublayer (i.e., the second sublayer) 62. Therefore, even if the etch rates of the sublayers 61 and 62 made of SiN are greater than the etch rate of the photoresist film 8, the higher etch-rate sublayer 62 is side-etched and as a result, the etching profile of the lower etch-rate sublayer 61 is tapered, as shown in FIGS. 11A to 11C.

Moreover, the thickness of the higher etch-rate sublayer 62 is equal to or less than the thickness of the pixel electrode layer 7. Thus, even if the etching profile of the higher etch-rate sublayer 62 is square or inverted tapered, the pixel electrode layer 7 will not be divided or cut.

When the ratio of the etch rate of the higher etch-rate sublayer 62 to the etch rate of the lower etch-rate sublayer 61, each of which is separately measured in the non-stacked state, is greater than unity, the etch rate of the lower etch-rate sublayer 61 decreases due to consumption of the etchant by the higher etch-rate sublayer 62 and therefore, the effective etch-rate ratio increases. Therefore, it is sufficient for the invention that the etch rate of the higher etch-rate sublayer 62 is 1.1 times as much as that of the lower etch-rate sublayer 61, or greater.

Such the etch rate control of the first and second sublayers 61 and 62 of the passivation layer 60 made of SiN as above can be realized by adjusting the flow rate of silane ($SiH_4$) gas as a reaction gas in the plasma-enhanced CVD process for forming the sublayers 61 and 62. For example, if the flow rate of $SiH_4$ is reduced to 90% from 100%, the etch rate of the first and second sublayers 61 and 62 increases to 1.1 times. If the flow rate of $SiH_4$ is reduced to 60% from 100%, the etch rate the sublayers 61 and 62 increases to 1.4 times. In these two cases, the quality difference of the deposited sublayers 61 and 62 can be observed or inspected by using a Fourier transform infrared spectrophotometer (FT-IR).

Specifically, when the etch rate ratio of the first and second sublayers 61 and 62 is 1.1 (in other words, the etch rate of the higher etch-rate sublayer 62 is 1.1 times as much as that of the lower etch-rate sublayer 61), the ratio (N—H/Si—H) of the N atom count (N—H) bonded to H atom to the Si atom count (Si—H) bonded to H atom of the higher etch-rate sublayer 62 is 2.3 times as much as that of the lower etch-rate sublayer 61. Similarly, when the etch rate ratio of the sublayers 61 and 62 is 1.4, the ratio (N—H/Si—H) of the N atom count (N—H) bonded to H atom to the Si atom count (Si—H) bonded to H atom of the higher etch-rate sublayer 62 is 6.2 times as much as that of the lower etch-rate sublayer 61.

As a result, when the etch rate ratio of the sublayers 61 and 62 is 1.1, the composition ratio of N to Si (the N/Si ratio) of the higher etch-rate sublayer 62 is 1.7 times as much as that of the lower etch-rate sublayer 61. Similarly, when the etch rate ratio of the sublayers 61 and 62 is 1.4, the composition ratio of N to Si (the N/Si ratio) of the higher etch-rate sublayer 62 is 4.6 times as much as that of the lower etch-rate sublayer 61. Here, it is supposed that the possibility of the H-atom termination of the passivation layer 60 (i.e., the sublayers 61 and 62) does not change.

Subsequently, to form the pixel electrode layer 7, an ITO layer is formed on the passivation layer 60 (i.e., the second sublayer 62) by sputtering and then, the ITO layer is selectively etched by a photolithography process and a wet etching process using a mixture of hydrochloric acid (HCl) and nitric acid ($HNO_3$). Thus, the pixel electrode layer 7 is formed on the passivation layer 60 without division or cut in the gate terminal section 11, the contact hole section 9, and the drain terminal section 13, respectively, as shown in FIGS. 12A to 12C.

Through the above-described process steps, the TFT-array substrate 10 according to the first embodiment of the invention is fabricated.

Second Embodiment

Figure 14:
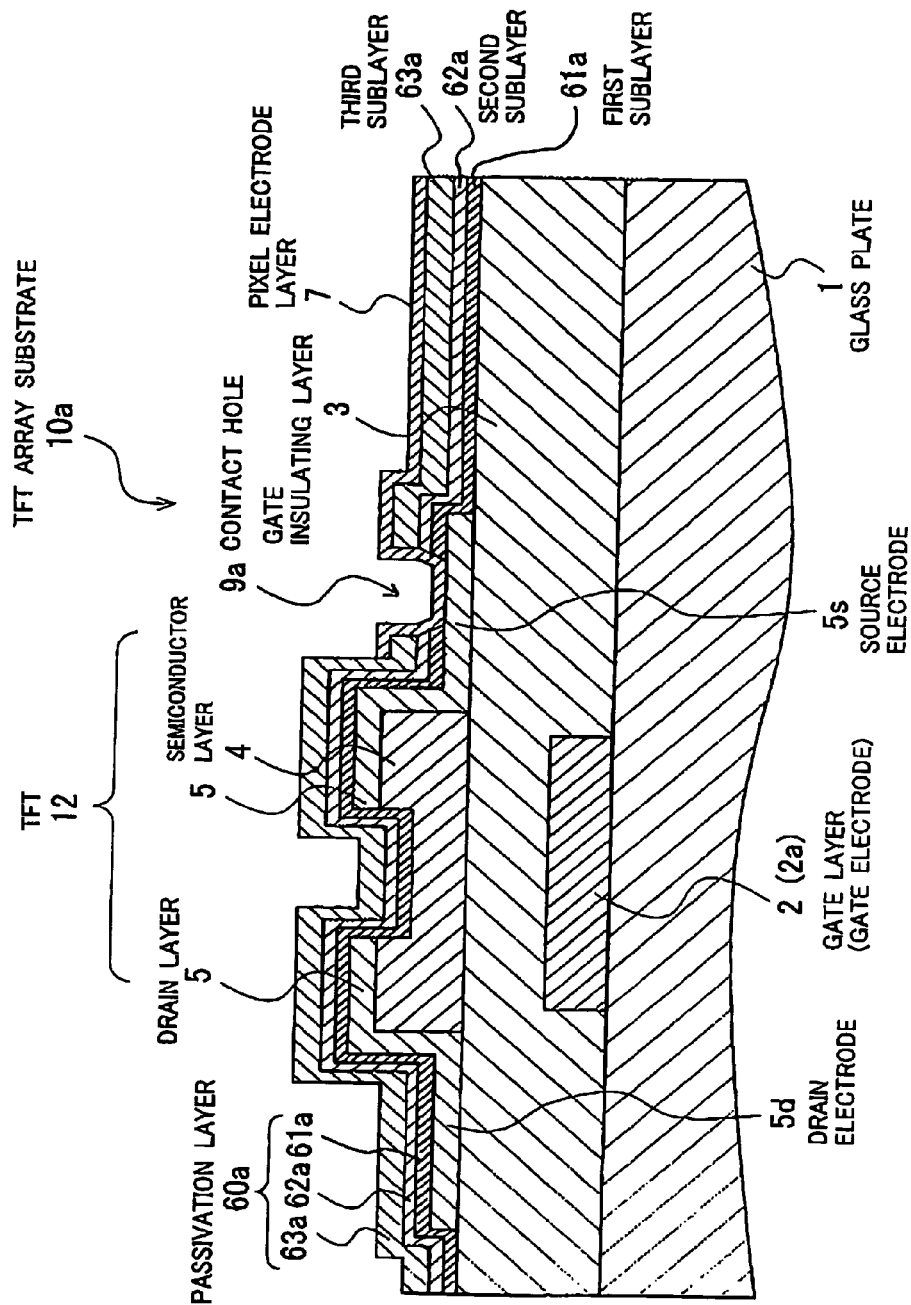
FIG. 14 is a partial cross-sectional view of a TFT array substrate according to a second embodiment of the present invention.

FIG. 14 schematically shows the structure of a TFT array substrate 10a of a LCD device according to a second embodiment of the present invention. Since the structure of the substrate 10a is the same as that of the substrate 10 of FIGS. 9 and 13 except that a passivation layer 60a has a three-layer structure comprising first, second, and third sublayers 61a, 62a, and 63a. Therefore, explanation about the substrate 10a of the second embodiment is omitted here by attaching the same reference symbols as those in the first embodiment.

The etch rate of the third sublayer 63a is the highest and the etch rate of the first sublayer 61a is the lowest. The etch rate of the second sublayer 62a is middle. Thus, the etch rates of the sublayers 61a, 62a, and 63a decrease from the top sublayer (i.e., the third sublayer 63a) disposed at the top of the layer 60a to the bottom sublayer (i.e., the first sublayer 61a) disposed at the bottom thereof.

The etch rate of the next sublayer (i.e., the second sublayer 62a) of the passivation layer 60a next to the top sublayer (i.e., the third sublayer 63a) is 1.1 times as much as that of the top sublayer, or greater.

The top sublayer (i.e., the third sublayer 63a) has a thickness equal to or less than that of the pixel electrode layer 7.

With the TFT array substrate according to the second embodiment, it is obvious that the same advantages as those of the first embodiment are obtainable.

Other Embodiments

Since the above-described first and second embodiments are embodied examples of the present invention, it is needless to say that the present invention is not limited to these embodiments and their variations. Any other modification is applicable to these embodiments and variations.

For example, in the above-described first and second embodiments of the invention, the passivation layer is formed by two or three sublayers stacked. However, the invention is not limited these structures. The passivation layer may be formed by three or more sublayers stacked if the etch rates of the sublayers decrease from the top sublayer disposed at the top of the passivation layer to the bottom sublayer disposed at the bottom thereof, and the top sublayer has a thickness equal to or less than that of the pixel electrode layer 7.

In the above embodiments, the gate layer is formed by the Mo and Al layers stacked, and the drain layer is formed by the Mo layer. However, the invention is not limited to this case. Each of the gate layer and the drain layer may be formed by a metal such as Al, Ti, Cr, Cu, Mo, Ag, Ta, and W or an alloy thereof.

In the above embodiments, although the pixel electrode layer is formed by ITO, the invention is not limited to this. For the transmissive type LCD device, the pixel electrode layer may be formed by at least one selected from the group consisting of an alloy (IZnO) of indium oxide and zinc, tin oxide (SnO$_2$), and zinc oxide (ZnO). For the reflection type LCD device, the pixel electrode layer may be formed by at least one selected from the group consisting of Al, Ag, and alloys thereof. For the semi-transmissive type LCD device, the pixel electrode layer may be formed by at least one selected from these two groups.

In the above embodiments, the TFT array substrate is fabricated by using five photolithography processes. However, for example, the steps of forming the semiconductor layers and the drain layer may be carried out through a single photolithography process using a halftone mask. If so, the TFT array substrate can be fabricated by using four photolithography processes. In this way, the count of photolithography processes is variable.

The type or structure of the TFT is not limited to the above-described structure shown in FIGS. 9 and 14. The TFT may have any other type or structure.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A thin-film transistor comprising:
a gate layer, a gate insulating layer, a semiconductor layer, a drain layer, and a passivation layer that are formed one of on an insulating substrate and over said insulating substrate; and
a conductive layer formed on the passivation layer, the conductive layer being connected to one of the gate layer and the drain layer by way of a contact hole penetrating at least the passivation layer,
wherein the passivation layer has a multiple-layer structure comprising at least a first sublayer and a second sublayer stacked, the first sublayer having an etch rate lower than an etch rate of the second sublayer,
wherein the first sublayer is disposed closer to the insulating substrate than the second sublayer,
wherein the second sublayer has a thickness equal to or less than a thickness of the conductive layer,
wherein the passivation layer comprises silicon nitride (SiN), and
wherein a ratio of an N atom count bonded to an H atom to a Si atom count bonded to the H atom (N—H/Si—H) of the second sublayer of the passivation layer comprising SiN is equal to or greater than 2.3 times as much as a ratio of an N atom count bonded to an H atom to a Si atom count bonded to the H atom (N—H/Si—H) of the first sublayer.

2. A thin-film transistor, comprising:
a gate layer, a gate insulating layer, a semiconductor layer, a drain layer, and a passivation layer that are formed one of on an insulating substrate and over said insulating substrate; and
a conductive layer formed on the passivation layer, the conductive layer being connected to one of the gate layer and the drain layer by way of a contact hole penetrating at least the passivation layer,
wherein the passivation layer has a multiple-layer structure comprising at least a first sublayer and a second sublayer stacked, the first sublayer having an etch rate lower than an etch rate of the second sublayer,
wherein the first sublayer is disposed nearer to the insulating substrate than the second sublayer,
wherein the second sublayer has a thickness equal to or less than a thickness of the conductive layer, and
wherein a ratio of an N atom count bonded to an H atom to a Si atom count bonded to the H atom (N—H/Si—H) of the second sublayer of the passivation layer is equal to or greater than 2.3 times as much as a ratio of an N atom count bonded to an H atom to a Si atom count bonded to the H atom (N—H/Si—H) of the first sublayer.

3. A thin-film transistor, comprising:
a gate layer, a gate insulating layer, a semiconductor layer, a drain layer, and a passivation layer that are formed one of on an insulating substrate and over said insulating substrate; and
a conductive layer formed on the passivation layer, the conductive layer being connected to one of the gate layer and the drain layer by way of a contact hole penetrating at least the passivation layer,
wherein the passivation layer has a multiple-layer structure comprising at least a first sublayer, a second sublayer, and a third sublayer stacked, the first sublayer having an etch rate that is lower than an etch rate of the second sublayer, the third sublayer having an etch rate that is greater than said etch rate of said second sublayer and said etch rate of said first sublayer,
wherein the first sublayer is disposed nearer to the insulating substrate than the second sublayer, and
wherein said second sublayer and said third sublayer have thicknesses less than or equal to a thickness of said conductive layer.

4. The thin-film transistor according to claim 3, wherein said conductive layer comprises a pixel electrode layer.

5. The thin-film transistor according to claim 3, wherein said passivation layer comprises silicon nitride (SiN).

6. The thin-film transistor according to claim 1, wherein an entirety of said second sublayer is disposed on a surface of said first sublayer.

7. The thin-film transistor according to claim 3, wherein said gate layer is formed on an insulating plate, and wherein said insulating plate is formed nearer to said first sublayer than to said second sublayer.

8. The thin-film transistor according to claim 3, wherein said second sublayer is formed at an upper portion of said passivation layer and said first sublayer is formed at a lower portion of said passivation layer.

9. The thin-film transistor according claim 3, wherein said etch rate of said second sublayer is equal to or greater than 1.1 times said etch rate of said first sublayer.

10. The thin-film transistor according claim 3, wherein a ratio of an N atom count bonded to an H atom to a Si atom count bonded to the H atom (N—H/Si—H) of the second sublayer of the passivation layer is equal to or greater than 2.3 times as much as a ratio of an N atom count bonded to an H atom to a Si atom count bonded to the H atom (N—H/Si—H) of the first sublayer.

11. The thin-film transistor according to claim 3, wherein said third sublayer is formed at an upper portion of said passivation layer,
wherein said second sublayer is formed at a middle portion of said passivation layer, and
wherein said first sublayer is formed at a bottom portion of said passivation layer.

* * * * *